United States Patent
Lee et al.

(10) Patent No.: US 11,835,585 B2
(45) Date of Patent: Dec. 5, 2023

(54) BATTERY CURRENT MEASURING DEVICE AND METHOD

(71) Applicant: LG Energy Solution, Ltd., Seoul (KR)

(72) Inventors: Won Tae Lee, Daejeon (KR); Chang Bok Lee, Daejeon (KR); Sung Tack Hwang, Daejeon (KR)

(73) Assignee: LG Energy Solution, Ltd.

(*) Notice: Subject to any disclaimer, the term of this patent is extended or adjusted under 35 U.S.C. 154(b) by 181 days.

(21) Appl. No.: 17/420,176

(22) PCT Filed: Jan. 3, 2020

(86) PCT No.: PCT/KR2020/000140
§ 371 (c)(1),
(2) Date: Jul. 1, 2021

(87) PCT Pub. No.: WO2020/141944
PCT Pub. Date: Jul. 9, 2020

(65) Prior Publication Data
US 2022/0082629 A1   Mar. 17, 2022

(30) Foreign Application Priority Data
Jan. 4, 2019   (KR) .................. 10-2019-0001151

(51) Int. Cl.
*G01R 31/3842* (2019.01)
*G01R 31/374* (2019.01)
(Continued)

(52) U.S. Cl.
CPC ....... *G01R 31/3842* (2019.01); *G01R 31/374* (2019.01); *H02J 7/0047* (2013.01); *H02J 7/00712* (2020.01); *G01R 31/392* (2019.01)

(58) Field of Classification Search
None
See application file for complete search history.

(56) References Cited

U.S. PATENT DOCUMENTS

| 5,501,517 A | 3/1996 | Kiuchi |
| 6,504,697 B1 | 1/2003 | Hille |

(Continued)

FOREIGN PATENT DOCUMENTS

| CN | 1411138 A | 4/2003 |
| CN | 105137160 A | 12/2015 |

(Continued)

OTHER PUBLICATIONS

Search Report for European Application No. 20736203.9 dated Dec. 9, 2021. 2 pgs.
(Continued)

*Primary Examiner* — Jas A Sanghera
(74) *Attorney, Agent, or Firm* — Lerner David LLP (57) ABSTRACT

A battery current measuring device includes a switching element configured to control charging and discharging of a battery, an A/D converter configured to convert a voltage value across the switching element into a digital value, a temperature compensation unit having a diode structure capable of compensating for a resistance change according to a change of temperature of the switching element, and a current calculation unit configured to calculate a current flowing through the switching element based on the digital value of the voltage value, and the A/D converter converts the voltage value of the switching element into the digital value using a reference voltage inputted from the temperature compensation unit.

8 Claims, 11 Drawing Sheets

(51) Int. Cl.
*H02J 7/00* (2006.01)
*G01R 31/392* (2019.01)

(56) References Cited

U.S. PATENT DOCUMENTS

| | | |
|---|---|---|
| 10,110,158 B1 | 10/2018 | Charles |
| 2003/0038614 A1 | 2/2003 | Walters et al. |
| 2003/0067344 A1 | 4/2003 | Nanba et al. |
| 2004/0178779 A1 | 9/2004 | Walters et al. |
| 2004/0217744 A1 | 11/2004 | Walters et al. |
| 2006/0108971 A1* | 5/2006 | Ono ............... H02J 7/0048 320/104 |
| 2006/0164069 A1 | 7/2006 | Maier et al. |
| 2007/0170472 A1 | 7/2007 | Zhu |
| 2008/0029836 A1 | 2/2008 | Zhu |
| 2008/0192800 A1* | 8/2008 | Asada ............... G01K 1/16 374/E1.021 |
| 2008/0238529 A1 | 10/2008 | Kumagai |
| 2009/0087725 A1 | 4/2009 | Sim |
| 2010/0085025 A1 | 4/2010 | Kato |
| 2012/0262123 A1* | 10/2012 | Lee ............... G01R 1/20 320/134 |
| 2012/0306086 A1 | 12/2012 | Sugimura et al. |
| 2013/0300393 A1 | 11/2013 | Lee |
| 2014/0176003 A1 | 6/2014 | Cochran |
| 2014/0368254 A1 | 12/2014 | Lee et al. |
| 2015/0346245 A1 | 12/2015 | Kiep et al. |
| 2016/0178705 A1* | 6/2016 | Stirk ............... G01R 31/374 324/431 |
| 2016/0300653 A1 | 10/2016 | Kondo et al. |

FOREIGN PATENT DOCUMENTS

| | | |
|---|---|---|
| EP | 3079161 A1 | 10/2016 |
| JP | H03180784 A | 8/1991 |
| JP | H03296667 A | 12/1991 |
| JP | H06188641 A | 7/1994 |
| JP | 2000299631 A | 10/2000 |
| JP | 2000513816 A | 10/2000 |
| JP | 2001168699 A | 6/2001 |
| JP | 2002151163 A | 5/2002 |
| JP | 2003068980 A | 3/2003 |
| JP | 2008249374 A | 10/2008 |
| JP | 2009113676 A | 5/2009 |
| JP | 2009522819 A | 6/2009 |
| JP | 2012109912 A | 6/2012 |
| JP | 5093037 B2 | 12/2012 |
| JP | 2012253125 A | 12/2012 |
| JP | 2013083471 A | 5/2013 |
| JP | 2013239153 A | 11/2013 |
| JP | 5448706 B2 | 3/2014 |
| JP | 2016063335 A | 4/2016 |
| KR | 20040021680 A | 3/2004 |
| KR | 20090120924 A | 11/2009 |
| KR | 100971343 B1 | 7/2010 |
| KR | 20150016851 A | 2/2015 |
| KR | 101549545 B1 | 9/2015 |

OTHER PUBLICATIONS

International Search Report for Application No. PCT/KR2020/000140 dated Apr. 14, 2020, 3 pages.

* cited by examiner

BATTERY CURRENT MEASURING DEVICE AND METHOD

CROSS-REFERENCE TO RELATED APPLICATIONS

The present application is a national phase entry under 35 U.S.C. § 371 of International Application No. PCT/KR2020/000140, filed on Jan. 3, 2020, published in Korean, which claims priority from Korean Patent Application No. 10-2019-0001151, filed on Jan. 4, 2019, all of which are incorporated herein by reference.

TECHNICAL FIELD

The present invention relates to a battery current measuring device and method. In particular, the present invention relates to a device and method for measuring battery current without using a shunt resistor.

BACKGROUND ART

The charge/discharge current of the battery must be measured to calculate/compute not only the output but also battery information such as battery degeneration information and battery capacity. In addition, precise measurement accuracy is required in order to accurately calculate the battery information, and in order to meet this, conventionally, a battery current is measured using a precision resistor such as a shunt.

However, since these shunt resistors also occupy a large volume and add cost, assembly processes, and the like, a better solution is required.

SUMMARY

Technical Problem

As a means for measuring the current of the battery, an object of the present invention is to obtain an efficient battery current measuring means without using a shunt resistor that occupies a large volume and adds cost and assembly process.

Technical Solution

A battery current measuring device according to an embodiment of the present invention includes: a switch configured to control charging and discharging of a battery; an A/D converter configured to convert a voltage value across the switch into a digital value; a temperature compensation unit having a diode structure capable of compensating for a resistance change according to a change of temperature of the switch; and a controller configured to calculate a current flowing through the switch based on the digital value of the voltage value, and the A/D converter is configured to convert the voltage value of the switch into the digital value using a reference voltage inputted from the temperature compensation unit.

According to one feature of this embodiment, the diode structure of the temperature compensation unit includes a plurality of diodes, and a number of the plurality of diodes and a connection configuration of the plurality of diodes are adapted to have a temperature-resistance curve matching a temperature-resistance curve of the switch.

According to another feature of this embodiment, the battery current measuring device further includes a voltage amplification unit configured to amplify the voltage value wherein the A/D converter is configured to convert the amplified voltage value across the switch into the digital value.

According to another feature of this embodiment, the reference voltage varies as a function of the diode structure and a temperature of the switch.

According to another feature of this embodiment, the temperature compensation unit is disposed close to the switch.

According to another feature of this embodiment, the switch is a MOSFET.

According to another feature of this embodiment, the battery current measuring device is installed on a substrate, and the temperature compensation unit and the MOSFET are formed on a same layer of the substrate.

A battery current measuring method according to an embodiment of the present invention includes: receiving a voltage across a switch for controlling charging and discharging of a battery; generating a reference voltage for compensating for a resistance change according to a temperature change of the switch; converting the voltage across the switch into a digital value using the generated reference voltage; and calculating a current flowing through the switch based on the digital value.

A battery pack according to an embodiment of the present invention includes: a battery capable of being charged and discharged; and a battery current measuring device as described in any of the embodiments herein.

A battery current measuring device according to an embodiment of the present invention includes: a switch configured to control charging and discharging of a battery; an A/D converter configured to convert a voltage across the switch into a digital value; a temperature compensation unit including a diode structure that is adapted to have a temperature-resistance curve matching a temperature-resistance curve the switch, wherein the diode structure of the temperature compensation unit is capable of compensating for a resistance change according to a temperature change of the switch; a subtractor configured to receive the voltage across the switch and an output of the temperature compensation unit and output a constant voltage signal; and a controller configured to calculate a current flowing through the switch based on the digital value of the voltage, and the A/D converter is configured to convert the constant voltage signal output by the subtractor into the digital value using a fixed reference voltage.

Advantageous Effects

The present invention is to measure the current of the battery using a semiconductor switch to turn on/off the battery without using a shunt resistor so that the volume can be reduced and it is more efficient in terms of cost and production process.

DETAILED DESCRIPTION

Hereinafter, some embodiments of the present invention will be described in detail through exemplary drawings. It should be noted that, in assigning reference numerals to components of each drawing, although the components are displayed on different drawings, like reference numerals refer to like components. Additionally, in describing the inventive concept, detailed descriptions of well-known configurations or functions will be omitted if it is determined that they would obscure the subject matter of the inventive concept.

In order to solve the problem of the above-mentioned shunt resistor, the present invention includes a method and device that can measure current using essential components of the battery to measure the current of the battery without using a shunt resistor.

In general, a switching element for controlling charging and discharging by turning on/off a battery must be essentially present, and the switching element is composed of a semiconductor device such as a MOSFET.

Since the resistance of semiconductor devices such as MOSFETs is generally similar to shunt resistors, although there is the method of measuring the current through the conventional method, semiconductors have not been used to measure practically accurate currents because of the large magnitude of change in resistance with temperature.

However, the present invention includes the diode configuration as described below, thereby making it possible to accurately measure the current of the battery by supplementing the difficulty of accurate current measurement according to the resistance change of the MOSFET with temperature. Hereinafter, the configuration of the present invention will be described in more detail.

Here, the type of battery is not particularly limited, and for example, the battery may be composed of a lithium ion battery, a lithium polymer battery, a nickel cadmium battery, a nickel hydrogen battery, a nickel zinc battery, and the like.

In addition, a plurality of battery cells are formed of a battery module connected in series and/or parallel, and at least one battery module is combined with a Battery Management System (BMS) to form a battery pack.

The BMS estimates the state of the battery and manages the battery using the estimated state information.

Hereinafter, the battery cell or battery module will be referred to simply as a battery.

Figure 1:
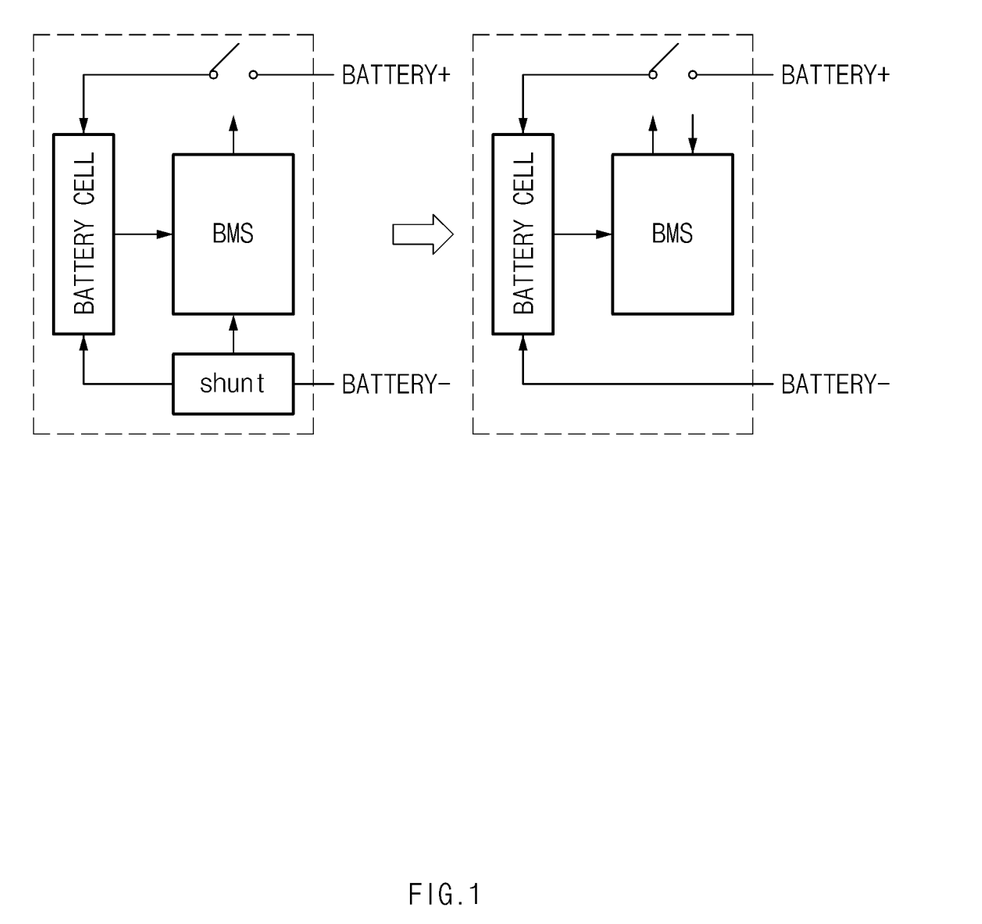
FIG. 1 is a view briefly comparing a conventional battery current measuring device with a battery current measuring device according to an embodiment of the present invention.

FIG. 1 is a view briefly comparing a conventional battery current measuring device with a battery current measuring device according to an embodiment of the present invention.

In FIG. 1, the view on the left side is a simplified diagram of a battery current measuring device for measuring current of a battery using a conventional shunt resistor.

In order to measure the battery current, a shunt resistor is connected in series on one side of the battery, and the BMS calculates the battery current by measuring the voltage across the connected shunt resistor. Hereinafter, the battery current measuring method through the shunt resistor will be described in more detail.

A shunt resistor is connected in series on one side of the battery and the voltage across the shunt resistor is measured by a voltage measurement unit. The voltage across the shunt resistor is amplified by the voltage amplification unit because of its small size.

The voltage amplified by the voltage amplification unit is converted to a digital value through an analog to digital (A/D) converter. In this case, the reference voltage of the A/D converter may be a fixed value, for example, 5 V.

The digital signal converted by the A/D converter is transmitted to the microcontroller unit (MCU). In the MCU receiving the digital signal, the current of the battery is calculated using the received digital signal.

Here, the voltage measurement unit, the voltage amplification unit, the A/D converter, and the MCU are included in the Battery Management System (BMS).

In addition to the shunt resistor, a switching element for controlling charging and discharging of the battery is located on the current path between the battery and the output terminal. The switching element is generally a semiconductor device, preferably a MOSFET. The switching element receives the control signal from the BMS to perform charging and discharging of the battery.

In FIG. 1, the view on the right side is a simplified diagram of a battery current measuring device according to an embodiment of the present invention.

The battery current measuring device according to an embodiment of the present invention does not include a shunt resistor unlike a conventional battery current measuring device.

However, a battery current is calculated by using a switching element, for example, a MOSFET, for controlling charging and discharging of the battery.

That is, in embodiments of the present invention, the voltage across the MOSFET is measured by the voltage measurement unit. However, MOSFETs are semiconductor devices, and the resistance changes greatly with the change in temperature. The MOSFET is directly connected to the battery because it performs charging/discharging control of the battery, and because of the heat generated during battery charging/discharging, MOSFETs are also affected by battery heat. Therefore, it is difficult to accurately measure the voltage of the MOSFET as the resistance changes due to the heat of the MOSFET.

Therefore, the present invention includes a separate temperature compensation unit to compensate for the resistance change caused by the heat of the MOSFET. This will be described later.

The voltage measured across the MOSFET is amplified by the voltage amplification unit. The amplified signal is converted into a digital signal by the A/D converter. That is, the A/D converter converts the voltage across the switching element into a digital value.

However, as described above, in order to compensate for the resistance change caused by the temperature change of the MOSFET, the reference voltage of the A/D converter is changed. In order to change the reference voltage of the A/D converter, a diode structure is connected to the A/D converter. The diode structure may be composed of a single or a plurality of diodes.

In addition, since the resistance may vary depending on the type and number of MOSFET devices and their connection configurations, the diode connected to the A/D converter is selected to have the same voltage drop characteristic as the MOSFET, or a plurality of diodes are connected in series and in parallel to allow the temperature curve to be the same as that of the MOSFET. That is, the plurality of diodes have a temperature-resistance curve that matches the temperature-resistance curve of the MOSFET which is the switching element. Here, as the temperature curve is more similar to that of the MOSFET, the accuracy of the current measurement becomes higher.

For more accurate measurements with the same temperature curve as the MOSFET, a plurality of diodes connected to the A/D converter are placed on the same copper plate as the MOSFET and placed close to the MOSFET to create an environment with a temperature that is identical to a temperature that affects the MOSFET.

The digital signal converted by the A/D converter is transmitted to the MCU which is a current calculation unit. The MCU receiving the digital signal from the A/D converter converts the digital signal to the current flowing through the switching element again. The charge/discharge current of the battery can be calculated from the current flowing through the switching element. Battery state information such as battery degeneration degree and capacity is calculated/computed by using the battery charge/discharge current converted in the MCU.

Figure 2:
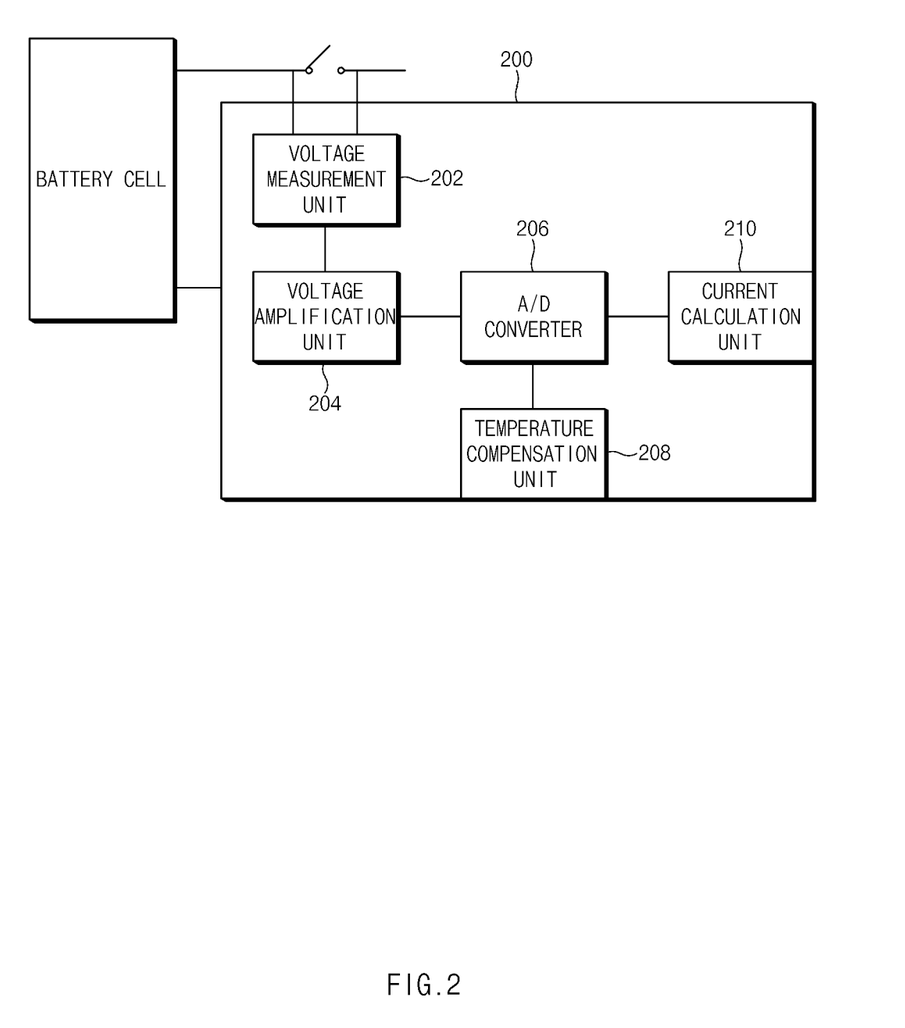
FIG. 2 is a block diagram of a battery current measuring device according to an embodiment of the present invention.

FIG. 2 is a block diagram of a battery current measuring device 200 according to an embodiment of the present invention.

The battery current measuring device 200 includes a switching element 201, a voltage measurement unit 202, a voltage amplification unit 204, an A/D converter 206, a temperature compensation unit 208, and a current calculation unit 210.

The switching element 201 is formed in the charge/discharge path between the battery and the output terminal of the battery. The switching element 201 is controlled to be On/Off based on the control signal of the BMS, thereby supplying the power stored in the battery to the outside or charging the battery with external power. In the embodiments of the present invention, the switching element 201 may be, for example, a MOSFET, but is not limited thereto and any switching element may be applied as long as the switching element changes resistance depending on temperature.

The voltage measurement unit 202 measures the voltage across the switching element 201. Here, the voltage measurement unit 202 is configured to measure the voltage across the switching element 201 as an analog value, such as an analog front end. The voltage measurement unit 202 transmits the measured voltage signal across the switching element to the voltage amplification unit 204. The voltage across the switching element 201 may be amplified in the voltage amplification unit 204 without the voltage measurement unit 202.

The voltage amplification unit 204 amplifies the voltage across the switching element applied directly from the switching element 201 or through the voltage measurement unit 202. The amplified voltage of the switching element 201 is transmitted to the A/D converter 206.

The A/D converter 206 receives the amplified voltage signal of the switching element 201. The A/D converter 206 converts the receive voltage signal of the switching element 201 into a digital signal. That is, the A/D converter 206 converts the voltage across the switching element into a digital value. The A/D converter 206 uses a reference voltage that changes with temperature in converting the received voltage signal of the switching element 201 into a digital signal.

Specifically, the switching element 201 has a large change in resistance value with temperature. As the temperature of the switching element 201 is higher, the resistance becomes greater. Therefore, the switching element 201 is difficult to measure the correct voltage because the resistance is changed under the influence of the temperature change according to the heat generation of the battery. In order to supplement the characteristics of the switching element 201 and derive an accurate voltage value, the temperature compensation unit 208 including a plurality of diodes is connected to a reference voltage input terminal of the A/D converter.

The diode has a different voltage drop for a fixed current value as the temperature changes. Therefore, by using the diode type, number and connection configuration having a temperature-resistance curve similar to the resistance change curve with the temperature change of the switching element 201, it changes the reference voltage value of the A/D converter. As a result, it is possible to derive a more accurate voltage of the switching element 201 which is not affected by temperature.

That is, according to the present invention, the reference voltage applied to the A/D converter for measuring the voltage across the switching element 201 is a voltage that is changed according to a temperature rather than a fixed voltage, for example, 5 V. Diodes, which are semiconductor elements such as the switching element 201, have a forward voltage drop with temperature. Thus, the reference voltage changed through this diode compensates for the resistance change with temperature of the switching element 201.

At this time, in order to allow the diode to operate in the environment of the same temperature as the switching element 201, the diode is disposed on the same copper plate as the switching element 201 and is disposed close to the switching element 201.

As described above, the temperature compensation unit 208 is connected to the A/D converter 206 to apply a reference voltage, and is configured to compensate for voltage values, which change with resistance changes due to temperature changes in the switching element 201. That is, the reference voltage is changed depending on the diode structure and the temperature.

Specifically, the temperature compensation unit 208 includes a diode structure in which a plurality of diodes are connected in series and in parallel. That is, the temperature compensation unit 208 includes a diode structure capable of compensating for the resistance change according to the temperature change of the switching element. One end of the temperature compensation unit 208 is connected to the power supply voltage, and the other end is connected to the A/D converter 206. That is, the diode structure is connected in series between the power supply voltage and the A/D converter 206 so that the reference voltage generated by the temperature compensation unit 208 is applied to the A/D converter 206.

Since the diode is also a semiconductor device such as the switching element 201, the resistance value changes with temperature like the switching element 201. In addition, since the resistance varies depending on the type of the switching element 201, the type and number of diodes included in the diode structure and the connection configuration are adjusted to make the temperature-resistance curve the same. At this time, the accuracy of the measured voltage is determined by how similar the temperature-resistance curve of the switching element 201 and the temperature-resistance curve of the diode structure are. Meanwhile, the diode structure may include a single diode, and in this case, the single diode is selected to have the same voltage drop characteristic to compensate for the voltage change with the temperature of the entire switching element 201. Furthermore, the temperature compensation unit is disposed close to the switching element.

The A/D converter 206 receives the amplified measurement voltage of the switching element 201 received from the voltage amplification unit 204, converts the amplified voltage signal of the switching element 201 into a digital signal using the reference voltage determined by the temperature compensation unit 208, and transmits it to the current calculation unit 210.

The current calculation unit 210 calculates the battery current using the digital signal received from the A/D converter 206, and calculates and computes battery information, such as the degeneration degree of the battery and the battery capacity, using the calculated battery current.

Figure 3:
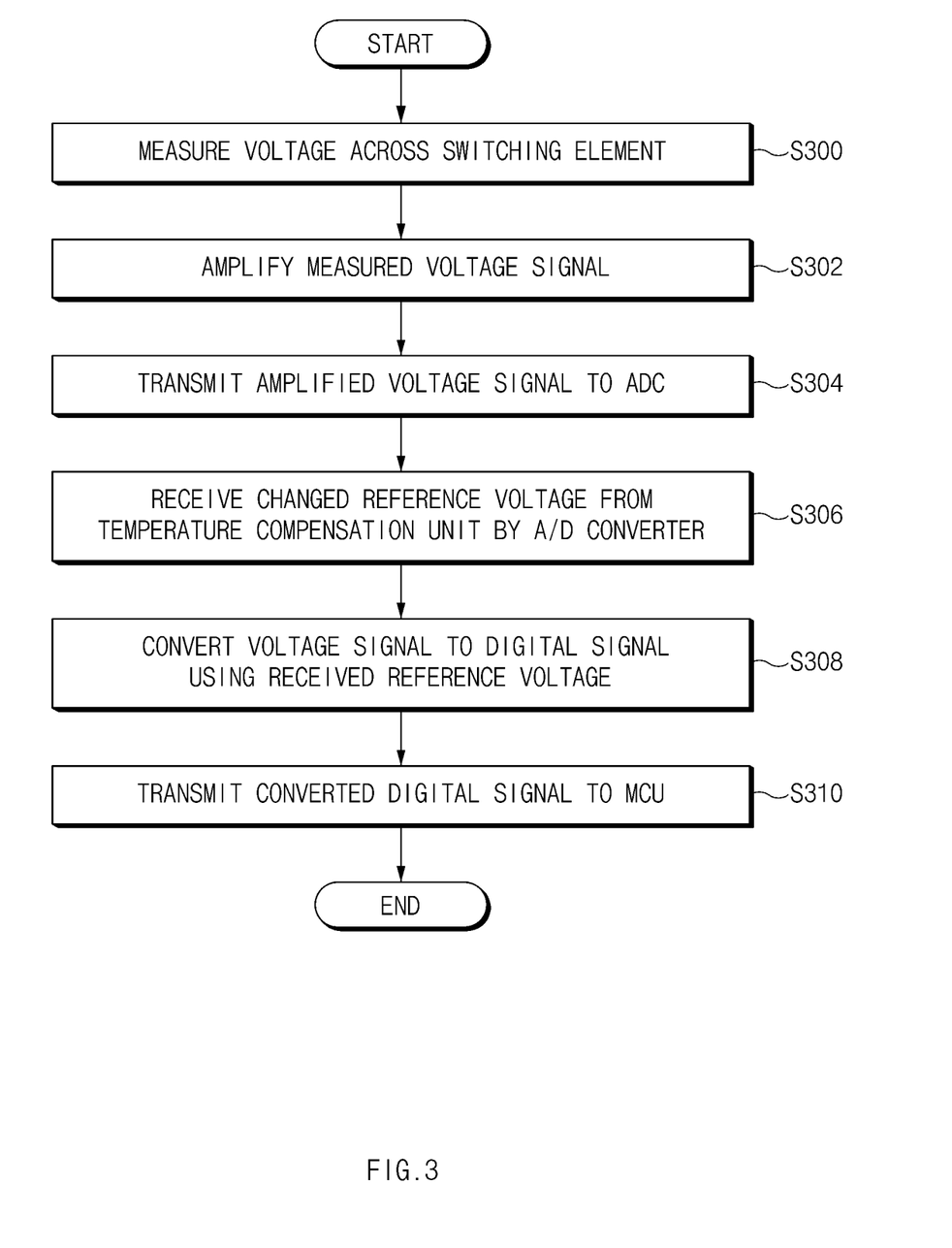
FIG. 3 is a flowchart illustrating a battery current measuring method according to an embodiment of the present invention.

FIG. 3 is a flowchart illustrating a battery current measuring method according to an embodiment of the present invention.

A switching element that controls the charging and discharging of the battery, for example, a MOSFET, is connected to the battery. MOSFETs are semiconductor devices and have a wide range of resistance changes with temperature. The voltage measurement unit 202 measures the voltage across the switching element 201 (S300). The voltage measurement unit 202 transmits the measured voltage signal across the switching element to the voltage amplification unit 204. The voltage across the switching element 201 may be amplified by the voltage amplification unit 204 immediately without the voltage measurement unit 202.

Here, in relation to the measured voltage, in order to compensate for the resistance change due to the temperature change of the switching element, the reference voltage of the A/D converter is changed. In order to change the reference voltage of the A/D converter, a diode structure is connected to the A/D converter. The diode structure may be composed of a single or a plurality of diodes. This will be described later.

The voltage signal of the switching element 201 transmitted to the voltage amplification unit 204 is amplified by the voltage amplification unit (S302). The amplified voltage signal of the switching element 201 is transmitted to the A/D converter 206 (S304).

The A/D converter 206 receiving the amplified voltage signal of the switching element 201 receives a reference voltage from the temperature compensation unit 208 (S306). That is, the reference voltage is set to compensate for the resistance change according to the temperature change of the switching element by the temperature compensation unit.

Specifically, the temperature compensation unit 208 includes a single or a plurality of diodes. The diode has a different voltage drop for a fixed current value as the temperature changes. Therefore, by using a diode having a temperature-resistance curve similar to the temperature-resistance curve with the change of temperature of the switching element 201 to change the reference voltage value of the A/D converter, the voltage of the switching element 201 can be derived to a more accurate voltage value that is not affected by temperature.

The voltage drop of the input voltage is made according to the temperature by the diode included in the temperature compensation unit 208 so that the reference voltage transmitted to the A/D converter 206 may be changed according to the temperature.

That is, according to the present invention, the reference voltage applied to the A/D converter for measuring the voltage across the switching element 201 is a reference voltage that is changed according to a temperature rather than a fixed voltage, for example, 5 V. Diodes, which are semiconductors such as the switching element 201, have a forward voltage drop with temperature. Thus, the reference voltage changed through this diode compensates for the resistance change with temperature of the switching element 201.

At this time, in order to allow the diode to operate in the environment of the same temperature as the switching element 201, the diode is disposed on the same copper plate as the switching element 201 and is disposed close to the switching element 201.

As described above, the temperature compensation unit 208 is connected to the A/D converter 206 to apply a reference voltage, and is configured to compensate for voltage values, which change with resistance changes due to temperature changes in the switching element 201.

The A/D converter 206 converts the measured voltage signal of the switching element 201 into a digital signal by using the applied reference voltage (S308). That is, the amplified voltage is converted into a digital value by using the reference voltage set by the A/D converter.

The A/D converter 206 transmits the converted digital signal to the current calculation unit 110 (S310).

The current calculation unit 110 receiving the digital signal calculates the current of the switching element 201 using the received digital signal to estimate the battery current, and obtains battery information using the estimated battery current.

Figure 4:
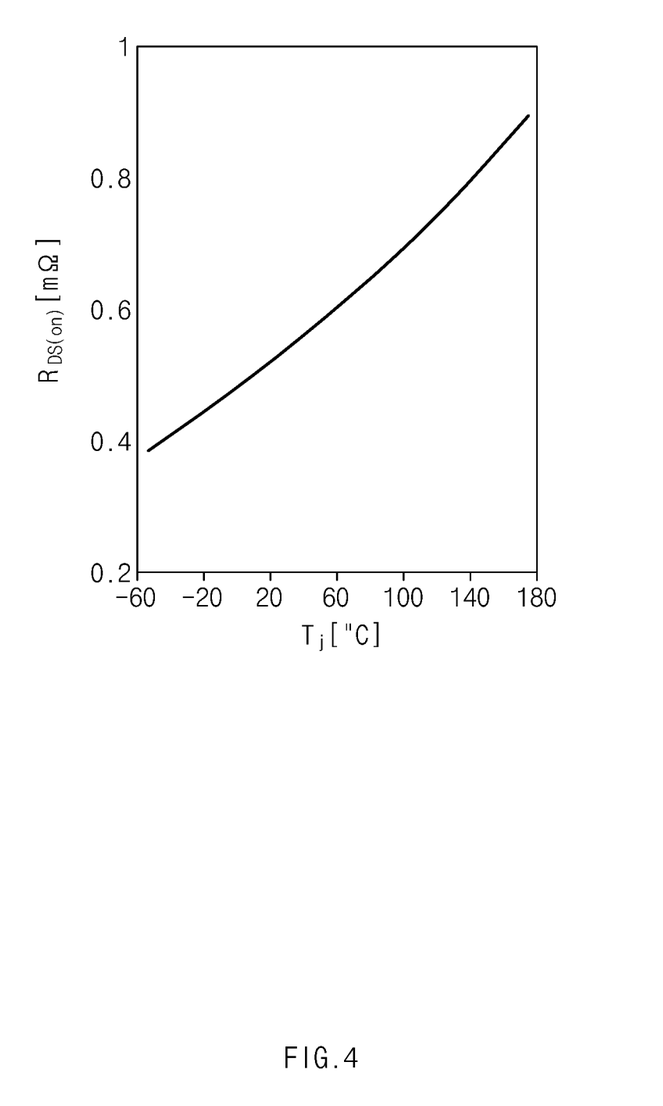
FIG. 4 is a graph illustrating a change in resistance according to a temperature change of a MOSFET.

FIG. 4 is a graph illustrating a change in resistance according to a temperature change of a MOSFET.

As the MOSFET has a resistance change with temperature as in the graph shown in FIG. 4, due to the changing resistance of the MOSFET, the current cannot be calculated accurately through V=I*R.

That is, even if the voltage across the MOSFET is measured equally, the calculated current will change with temperature because the resistance of the MOSFET changes with temperature. The MOSFET is directly connected to the battery because it controls the charging/discharging of the battery, and the switching element 201 is also affected by the heat generated during a battery charging/discharging process. Therefore, it is difficult to accurately measure the voltage of the MOSFET as the resistance changes due to the heat of the MOSFET.

For example, even if the measured voltage across the MOSFET is a V, since the resistance is 0.6 mΩ when the temperature of the MOSFET is 60° C., the current will be $a/(0.6*10^{-3})$A, and when the temperature of MOSFET is 140° C., since the resistance is 0.8 mΩ, the current will be $a/(0.8*10^{-3})$A. That is, since the resistance changes according to the temperature of the MOSFET, even if the measured voltage is the same, the resistance may vary depending on the temperature and thus the calculated current may be different.

In order to compensate for this, the present invention includes a separate temperature compensation unit to compensate for the voltage change according to the resistance change due to the heat of the MOSFET.

Figure 5:
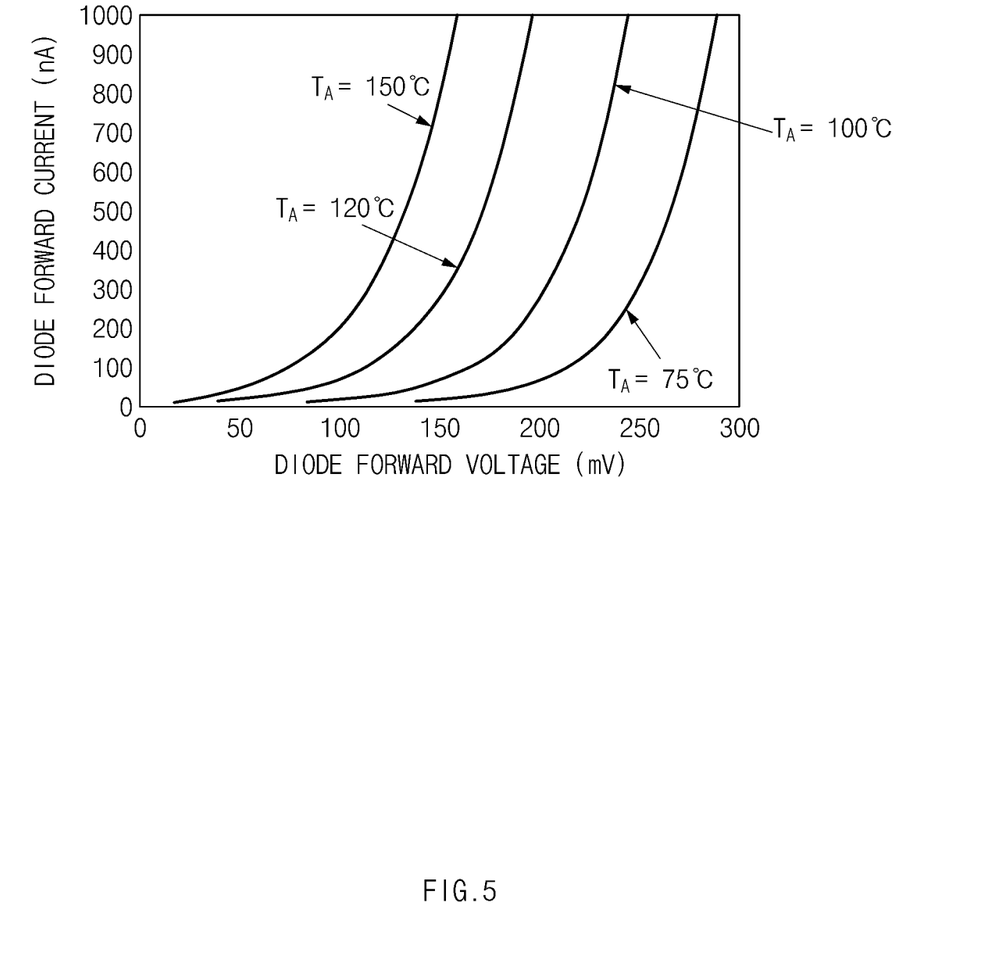
FIG. 5 is a graph showing a change in current and voltage according to the temperature of a diode.

FIG. 5 is a graph showing a change in current and voltage according to the temperature of a diode.

The forward voltage drop of the diode varies according to the temperature when the same current flows. Referring to the graph of FIG. 5, for example, if the current flows at 200 mA, a voltage drop of 100 mV is made at 150° C., a voltage drop of about 140 mV is made at 125° C., a voltage drop of about 190 mV is made at 100° C., and a voltage drop of about 230 mV is made at 75° C.

Thus, for example, if the input voltage of the diode structure is 5 V, by forward voltage drop of the diode, the reference voltage inputted to the A/D converter 206 is 4.9 V at 150° C., is about 4.86 V at 125° C., is about 4.81 V at 100° C., and is about 4.77 V at 75° C.

By using the characteristics of such a diode, it can be implemented as a single diode using a diode having a temperature curve most similar to that of the MOSFET, and a plurality of diodes can also be connected in series to compensate for the changed voltage values at the MOSFETs.

Figure 6:
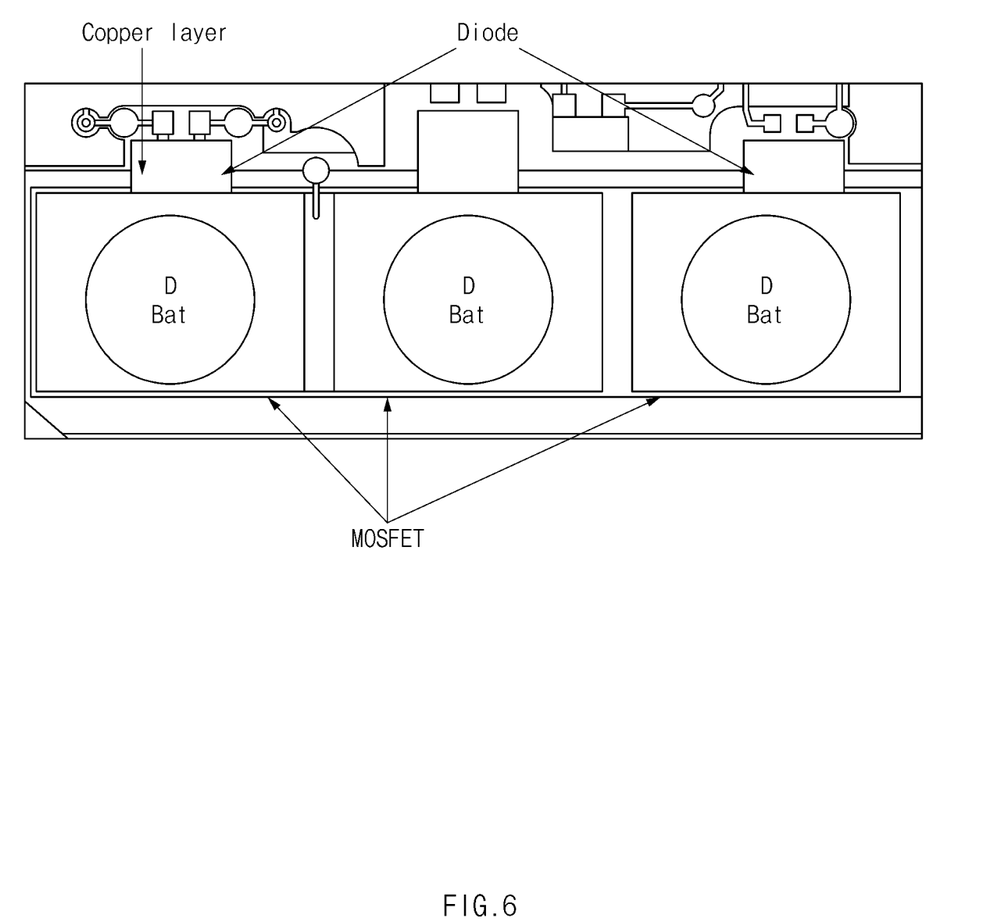
FIG. 6 is an implementation example according to an embodiment of the present invention.

FIG. 6 is an implementation example according to an embodiment of the present invention.

As shown in FIG. 6, the diode is disposed close to the MOSFET. In addition, the layer directly below the MOSFET layer, on which the MOSFET is disposed, extends under the diode so that the MOSFET and the diode are located on the same layer.

This is to reduce the temperature deviation by allowing the MOSFET and the diode to be disposed on the same layer.

In addition, since the resistance varies depending on the MOSFET device type and the number of parallels, the diode is also selected as a device with the same voltage drop characteristics as the MOSFET, or connected in series to have the same temperature-resistance curve as the MOSFET. Accuracy is determined by how similar this temperature-resistance curve is.

Figure 7:
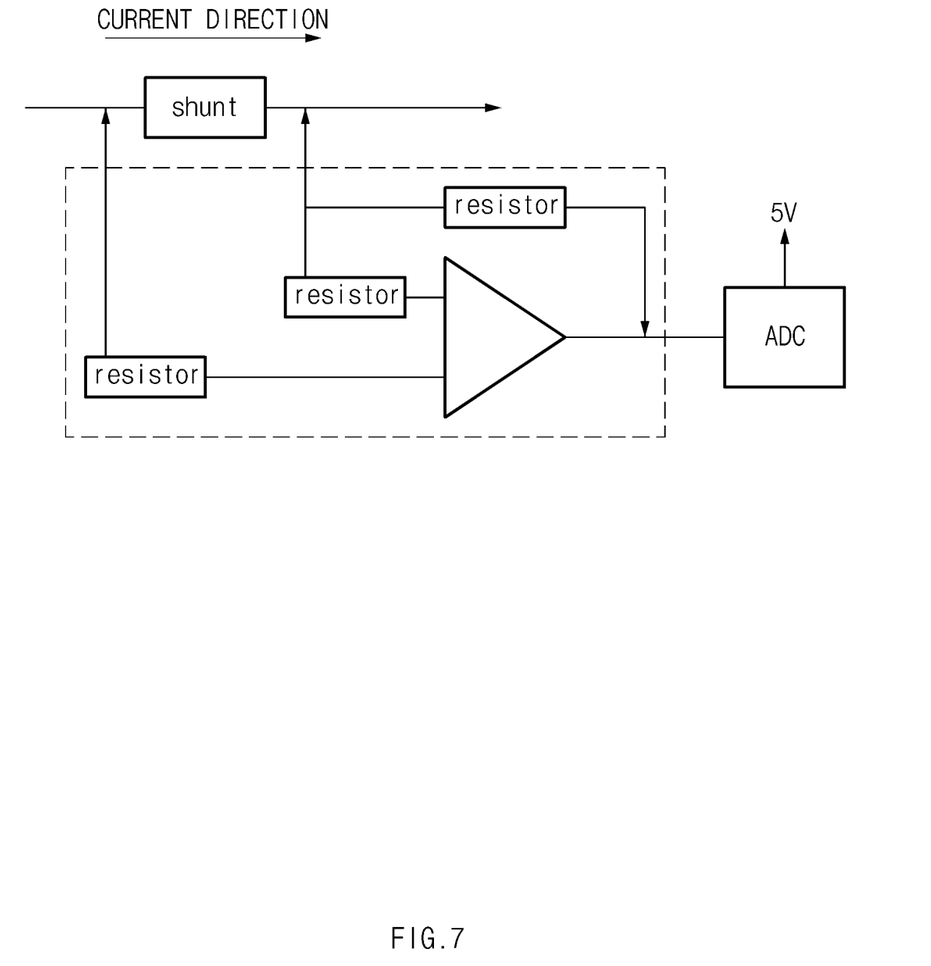
FIG. 7 is an exemplary configuration diagram of a battery current measuring device using a conventional shunt resistor.

FIG. 7 is an exemplary configuration diagram of a battery current measuring device using a conventional shunt resistor.

A shunt resistor is connected in series between the battery and the output terminal, and the voltage across the shunt resistor is small so that it is amplified by the voltage amplification unit.

The voltage amplified in the voltage amplification unit, for example, an operational amplifier (OP amp), is converted to a digital value through an analog to digital (A/D) converter. In this case, the reference voltage may be a fixed value, for example, 5 V.

The digital signal converted by the A/D converter is transmitted to the MCU. In the MCU receiving the digital signal, it is converted to a current value again using the received digital signal.

Figure 8:
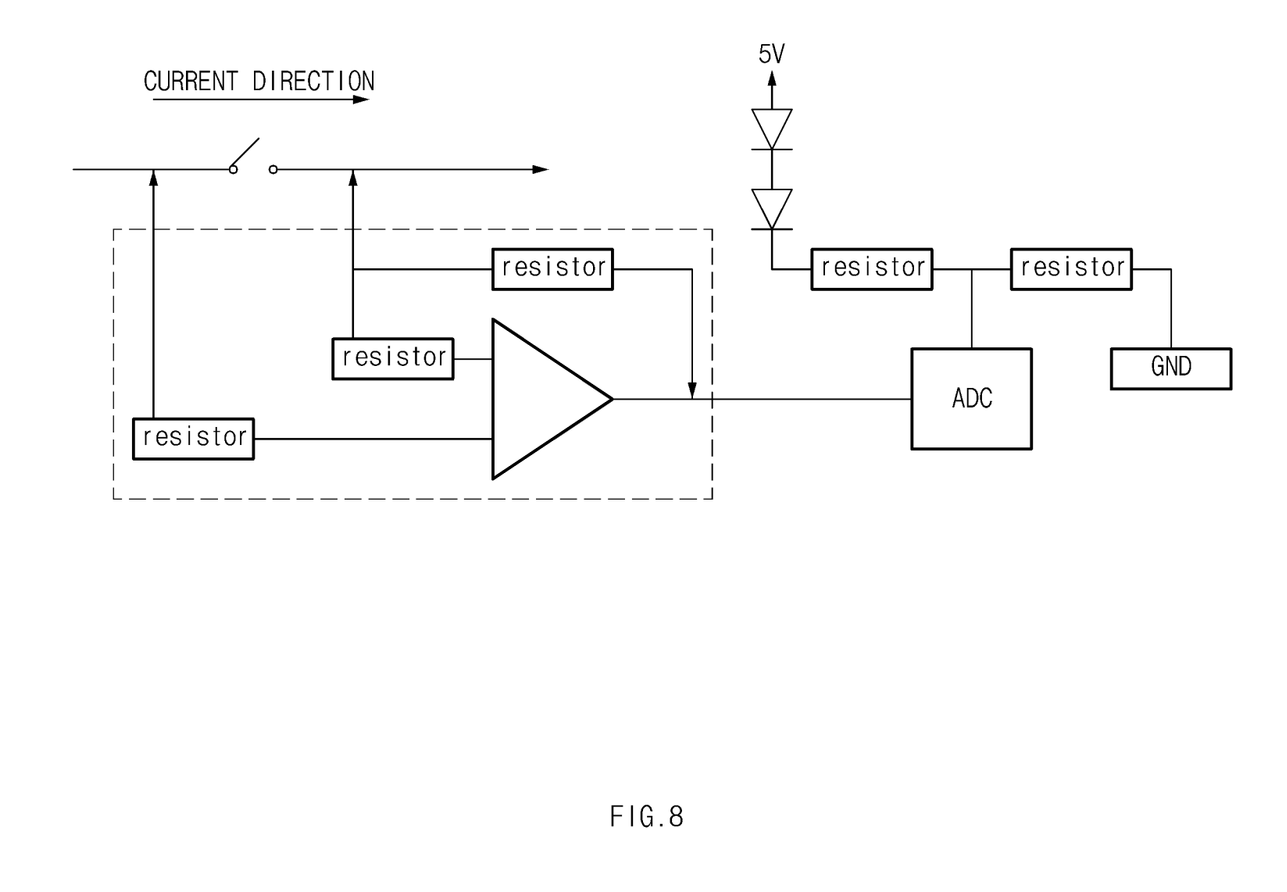
FIG. 8 is a configuration diagram of a battery current measuring device according to an embodiment of the present invention.

FIG. 8 is a configuration diagram of a battery current measuring device according to an embodiment of the present invention.

Battery current is measured using a switching element that controls charging and discharging of the battery, for example, a MOSFET. The MOSFET is a semiconductor device, and it is difficult to measure the accurate voltage due to a large change in resistance with the change of temperature.

After amplifying the voltage of the MOSFET through the OP amp, the amplified signal is converted into a digital signal in the A/D converter.

However, as described above, the MOSFET is difficult to accurately measure the voltage due to the large width of the resistance change with the temperature change. Therefore, in order to compensate for this, the reference voltage of the A/D converter is changed. In order to change the reference voltage of the A/D converter, a diode structure is connected to the A/D converter. The diode structure may be composed of a single or a plurality of diodes.

In addition, since the resistance may vary depending on the type and number of MOSFET devices and their connection configurations, the diode connected to the A/D converter is selected to have the same voltage drop characteristic as the MOSFET, or a plurality of diodes are connected in series and in parallel to allow the temperature-resistance curve to be same as that of the MOSFET. Here, as the temperature-resistance curve is more similar to that of the MOSFET, the accuracy of the current measurement becomes higher.

The digital signal converted by the A/D converter is transmitted to the MCU. The MCU receiving the digital signal from the A/D converter calculates the digital signal as a current again. Battery state information such as battery degeneration degree and capacity is calculated/computed by using the battery charge/discharge current converted in the MCU.

Figure 9:
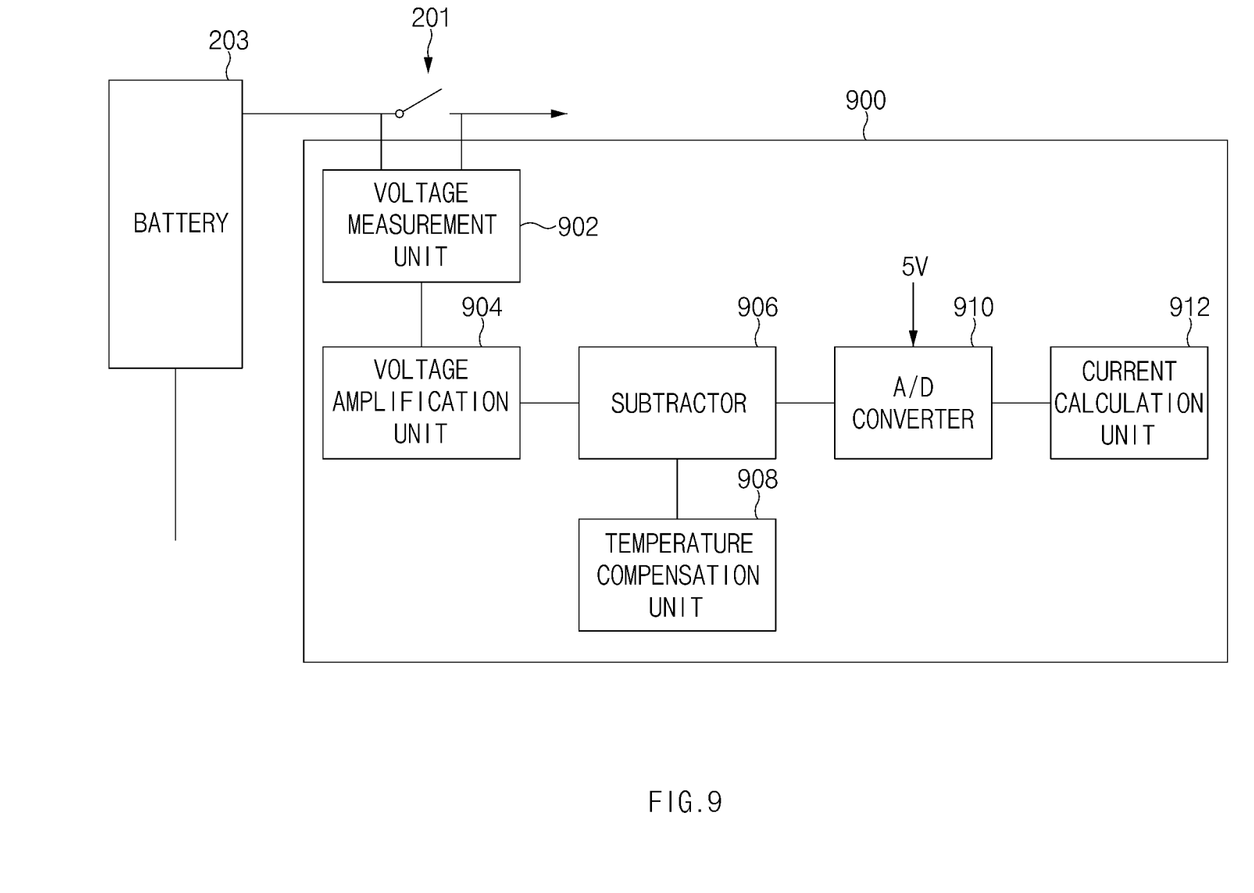
FIG. 9 is a configuration diagram of a battery current measuring device according to another embodiment of the present invention.

FIG. 9 is a configuration diagram of a battery current measuring device according to another embodiment of the present invention.

The configuration of FIG. 9 is the same as that of FIG. 2 except for the configuration in which a subtractor 906 is added and the configuration in which a temperature compensation unit 908 is connected to the subtractor. Therefore, the description will be mainly focused on the configuration different from that of FIG. 2.

The voltage across the measured switching element 201 is amplified, and the amplified voltage signal is inputted to the first input terminal of the subtractor 906. In addition, the output voltage signal of the temperature compensation unit 908 is inputted to the second input terminal of the subtractor 906.

Here, the temperature compensation unit 908 is configured to compensate for the voltage value changed according to the resistance change caused by the temperature change of the switching element 201, and has the same temperature-resistance curve as the switching element 201. Thus, like the output voltage signal of the voltage amplification unit 904 that changes with the temperature of the switching element 201, the output voltage signal of the temperature compensation unit 908 also changes with the temperature. Therefore, as a result, the difference between the voltage signals inputted to the first input terminal and the second input terminal of the subtractor 906 always remains constant. Accordingly, the output voltage signal of the subtractor 906 also remains constant regardless of the voltage change of the switching element 201 with temperature.

The output voltage signal of the subtractor 906 is inputted to the A/D converter 910, and the A/D converter 910 converts the output voltage signal received from the subtractor 906 into a digital signal using the fixed reference voltage and transmits the converted digital signal to the current calculation unit 912.

Figure 10:
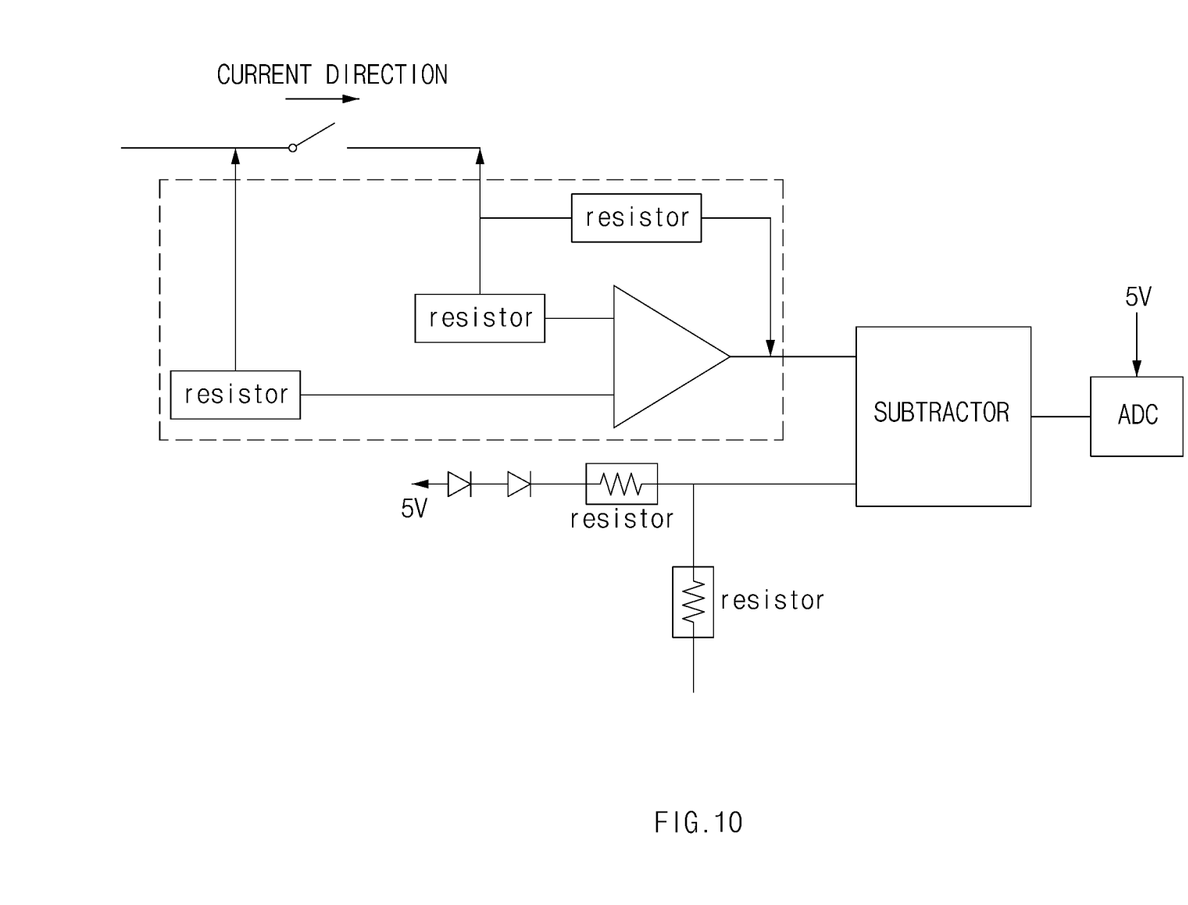
FIG. 10 is a configuration diagram of a battery current measuring device according to another embodiment of the present invention.

FIG. 10 is a configuration diagram of a battery current measuring device according to another embodiment of the present invention.

The configuration of FIG. 10 is the same as that of FIG. 8 except for the configuration in which a subtractor is added and the configuration in which a temperature compensation unit is connected to the subtractor. Therefore, the description will be mainly focused on the configuration different from that of FIG. 8.

After amplifying the measured MOSFET voltage through the OP amp, the amplified signal is inputted to the subtractor. However, since the MOSFET has a large change in resistance due to temperature change, in order to compensate for this, the other input terminal of the subtractor is connected with a diode structure which is a temperature compensation unit.

The diode structure connected to the subtractor includes a single or a plurality of diodes, and the diode structure has the same temperature-resistance curve as the MOSFET. Therefore, the difference between the output voltage signal of the diode structure inputted to the subtractor and the voltage across the MOSFET always remains constant, so that the output of the subtractor also remains constant.

The voltage signal outputted from the subtractor is inputted to the A/D converter, and the A/D converter converts the voltage signal outputted from the subtractor into a digital signal using a fixed reference voltage.

Figure 11:
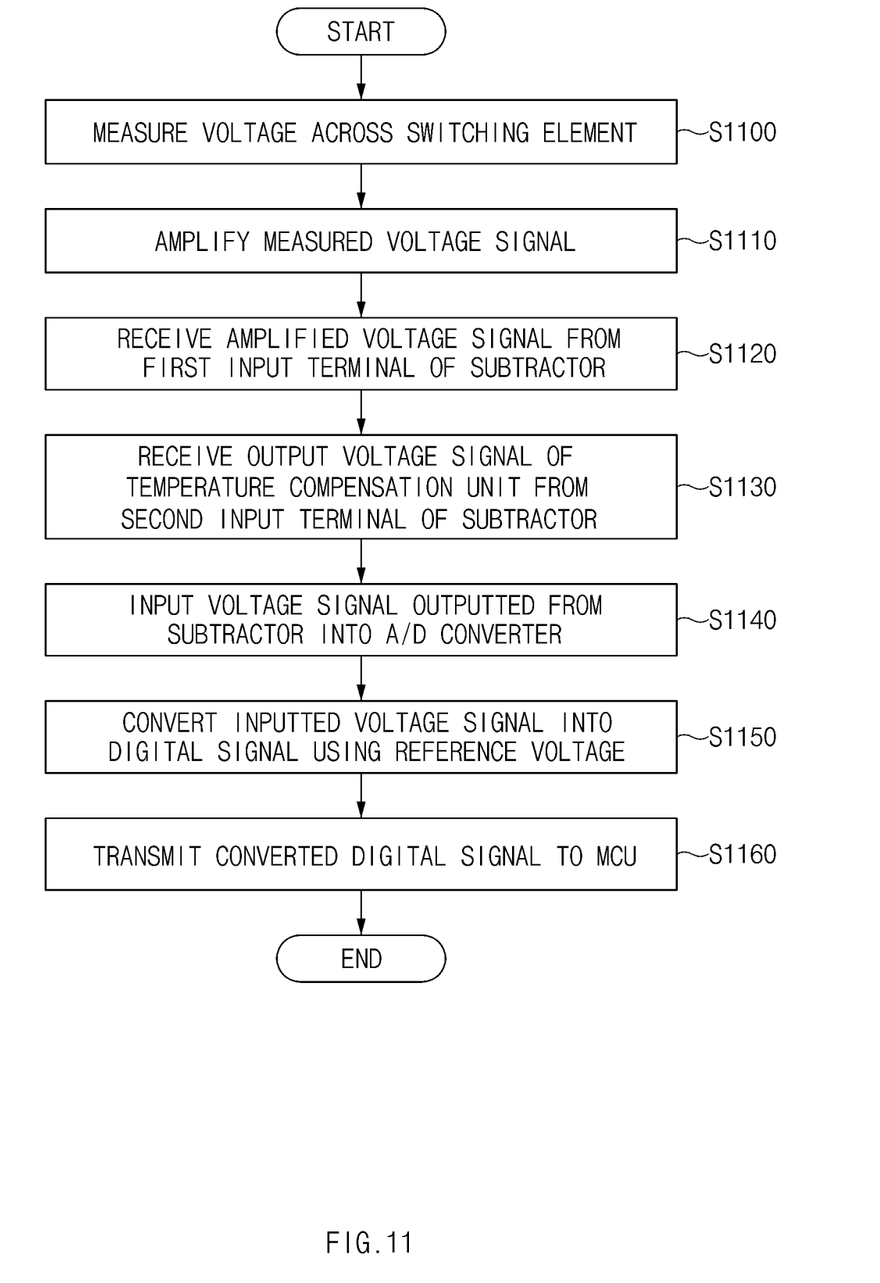
FIG. 11 is a flowchart illustrating a battery current measuring method according to another embodiment of the present invention.

FIG. 11 is a flowchart illustrating a battery current measuring method according to another embodiment of the present invention.

The voltage measurement unit 902 measures the voltage across the switching element 201 (S1100).

The measured voltage signal at both ends of the switching element 201 is amplified by the voltage amplification unit 904 (S1110). Here, the voltage across the switching element may be amplified by the voltage amplification unit 904 immediately without the voltage measurement unit 902.

The voltage signal at both ends of the switching element 201 amplified by the voltage amplification unit 904 is received at the first input terminal of the subtractor (S1120).

Meanwhile, the output voltage signal of the temperature compensation unit 908 connected to the other input terminal of the subtractor 906 is inputted to the second input terminal of the subtractor 906 (S1130).

As described above, the temperature compensation unit 908 is configured to compensate for the voltage value changed according to the resistance change caused by the temperature change of the switching element 201, and has the same temperature-resistance curve as the switching element 201. Thus, like the output voltage signal of the voltage amplification unit 904 that changes with the temperature of the switching element 201, the output voltage signal of the temperature compensation unit 908 also changes with the temperature.

Therefore, the difference between the both signals inputted to the subtractor always remains constant. Accordingly, even though the voltage of the switching element 201 changes with temperature, the output voltage signal of the subtractor 906 also remains constant.

The output voltage signal of the subtractor 906 is inputted to the A/D converter 910 (S1140).

The A/D converter 910 converts the inputted output voltage signal of the subtractor 906 into a digital signal using a fixed reference voltage, for example, 5 V (S1150), and transmits the digital signal to the MCU (S1160).

Although the present invention has been described above by limited embodiments and drawings, the present invention is not limited thereto, and it will be apparent to those skilled in the art that the present invention may be implemented in various ways within the equivalent scope of the technical spirit of the present invention and the claims to be described below.

The invention claimed is:

1. A battery current measuring device comprising:
   a switch configured to control charging and discharging of a battery;
   an A/D converter configured to convert a voltage value across the switch into a digital value;
   a temperature compensation unit having a diode structure capable of compensating for a resistance change according to a change of temperature of the switch; and
   a controller configured to calculate a current flowing through the switch based on the digital value of the voltage value,
   wherein the A/D converter is configured to convert the voltage value across the switch into the digital value using a reference voltage inputted from the temperature compensation unit;
   wherein the switch is a MOSFET,
   wherein the battery current measuring device is installed on a substrate, and wherein the temperature compensation unit and the MOSFET are formed on a same layer of the substrate.

2. The battery current measuring device of claim 1, wherein the diode structure of the temperature compensation unit comprises a plurality of diodes, and
   wherein a number of the plurality of diodes and a connection configuration of the plurality of diodes are adapted to have a temperature-resistance curve matching a temperature-resistance curve of the switch.

3. The battery current measuring device of claim 2, further comprising a voltage amplification unit configured to amplify the voltage value, wherein the A/D converter is configured to convert the amplified voltage value across the switch into the digital value.

4. The battery current measuring device of claim 2, wherein the reference voltage varies as a function of the diode structure and a temperature of the switch.

5. The battery current measuring device of claim 1, wherein the temperature compensation unit is disposed sufficiently close to the switch such that the diode and the switch are subject to substantially the same temperature change.

6. A battery pack comprising:
   a battery capable of being charged and discharged; and
   the battery current measuring device of claim 1.

7. The battery current measuring device of claim 1, wherein the diode structure is adapted to have a temperature-resistance curve that matches a temperature-resistance curve of the switch.

8. A battery current measuring device comprising:
   a switch configured to control charging and discharging of a battery;
   an A/D converter configured to convert a voltage across the switch into a digital value;
   a temperature compensation unit including a diode structure that is adapted to have a temperature-resistance curve matching a temperature-resistance curve the switch, wherein the diode structure of the temperature compensation unit is capable of compensating for a resistance change according to a temperature change of the switch;
   a subtractor configured to:
   receive the voltage across the switch and an output of the temperature compensation unit; and
   output a constant voltage signal; and a controller configured to calculate a current flowing through the switch based on the digital value of the voltage, wherein the A/D converter is configured to convert the constant voltage signal output by the subtractor into the digital value using a fixed reference voltage.

* * * * *